United States Patent [19]

Nakayama

[11] 3,983,563
[45] Sept. 28, 1976

[54] ANTENNA ADAPTER FOR TELEVISION
[76] Inventor: Koji Nakayama, 305, No. 1-1-1, Hara, Meguro, Tokyo, Japan
[22] Filed: Oct. 15, 1974
[21] Appl. No.: 514,888

[30] Foreign Application Priority Data
Oct. 16, 1973  Japan.............................. 48-120125

[52] U.S. Cl. ............................... 343/861; 343/906
[51] Int. Cl.² ........................................... H01Q 1/46
[58] Field of Search ............ 343/720, 905, 906, 861

[56] References Cited
UNITED STATES PATENTS
| | | | |
|---|---|---|---|
| 2,562,654 | 7/1951 | Williams | 343/720 X |
| 2,915,627 | 12/1959 | Spindler | 343/720 UX |
| 2,925,598 | 2/1960 | Williams | 343/861 |
| 2,991,355 | 7/1961 | Spindler | 343/906 X |

Primary Examiner—Paul L. Gensler
Attorney, Agent, or Firm—Toren, McGeady and Stanger

[57] ABSTRACT

An antenna adapter for television which comprises an input connecting element to be inserted into a plug socket for domestic use, which element is connected to one end of a feeder intermediately with a fuse connected in series, the other end thereof being formed so as to be connectable to the input terminal of the antenna, and a circuit-changing switch or a variable resistance in the midpoint of the feeder for appropriately changing the impedance of the feeder.

5 Claims, 2 Drawing Figures

U.S. Patent  Sept. 28, 1976  3,983,563
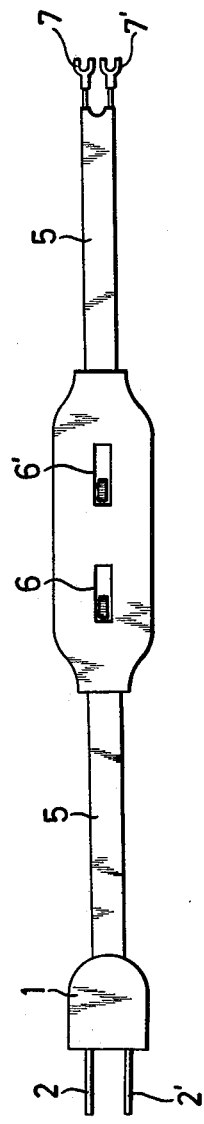
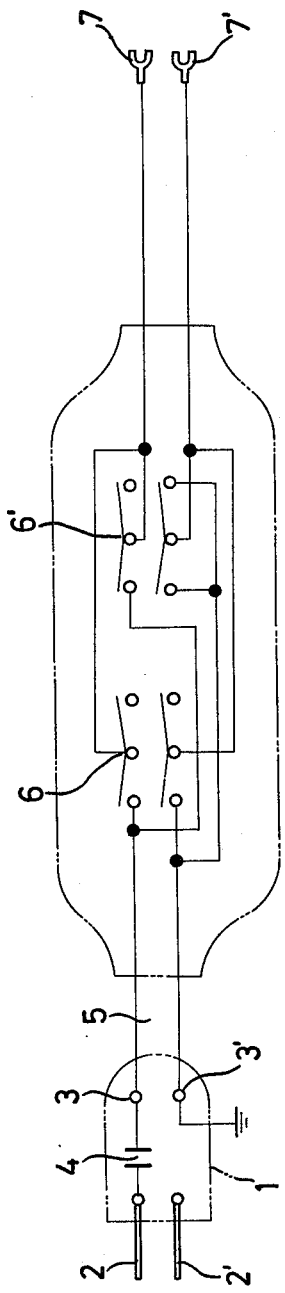
FIG.1
FIG.2

ANTENNA ADAPTER FOR TELEVISION

The present invention relates to an adapter to be used for the antenna of a television set, which is connected to a plug socket for electric source for general home use so as to receive the F.M. wave signal from air transmission through an electric lamp line.

For receiving F.M. electric waves of television, it has generally been common heretofore to build an outdoor antenna so as to transmit the electric waves from the antenna to the television receiver. However, such antennas have disadvantages in that they require considerable labor to install and expense to build. They also take, in addition, much labor for wiring a lead-in cable for the antenna (feeder cable). Further, great inconveniences have existed in such a case, since the wiring work was subjected to some limitation because of problems to the room decoration caused by the wiring; the displacement of the television receiver being also subjected thereby to some limitations.

The inventor of the present invention has formerly developed an antenna adapter for television leading in from the plug socket, the F.M. electric waves received through an electric lamp line. The present invention is a further improvement of the above antenna adapter for television which has been further advanced so as to obtain distinct images received of the television.

For instance, in the Kanto district of Japan, images put on the air from seven broadcasting stations are received by television receivers, but the images broadcasted from these seven broadcasting stations are impossible, by means of one antenna adapter, to be distinctly thrown on the screen of the television, because of the differences of impedance.

The present invention has been made in view of these facts, and an antenna adapter made so as to be able to increase or decrease the impedance of the antenna feeders in accordance with the conditions of the electric waves of each broadcasting station has been developed.

The present invention will now be explained more in detail with reference to the accompanying drawing showing examples of the antenna adapter for plug socket used for television according to the present invention, in which FIG. 1 is a plan view of said adapter, and FIG. 2 is an electric connection diagram showing the inner construction of said adapter.

In the FIGS. 1 and 2, 1 represents the body of a plug which has been formed with an insulating material, and to said body of the plug, are connected two projecting connectors 2 and 2' to be connected by insertion to an ordinary plug socket of domestic use, the one connector 2 being formed with an electric conductor (metallic), the other one 2' being formed with an insulating material (for example, a synthetic resin). Within the body of the plug 1, output terminals 3 and 3' are provided, and between the terminal 3 and the above-mentioned connector 2, a condenser 4 is provided in series. The reference 5 is an antenna feeder, one end of which is connected to the above-mentioned terminals 3 and 3', and in the midpoint of this feeder 5, two change-over switches 6 and 6', preferably of the sliding type, are connected substantially in parallel. At the other end of this feeder 5, terminals 7 and 7', which are connected to the terminal element of a television, are provided. Although it is not shown in the drawings showing the examples of the present invention, if a fuse is connected between the connector 2 and the condenser 4, the security of the antenna adapter will be more enhanced.

As understood clearly from the foregoing description, since two change-over switches 6 are provided within the midpoint of the antenna feeder 5, the impedance of the feeder is easily increased or decreased by the changingover operation of these switches 6, 6'. Accordingly, the present invention has an advantage in that distinct images can be received by making the feeder impedance of the feeder a value appropriate to the channel of each broadcasting station by the changeover of the switches.

Furthermore, the antenna adapter according to the present invention is simple in its construction and of low cost, and in addition, according to the present invention, since the F.M. electric waves for color television can be supplied from a plug socket for electric source, great practical advantages can be expected from this invention in that the troublesome problems such as the necessity of the provision of outdoor antenna, or the need of laying of a long electric wire for antenna can be solved, and in the possibility of free displacement of the television receiver to a desired position and so on.

In the examples illustrated herein, the increase or decrease of impedance is effected by two change-over switches of sliding type, the present invention shall not be limited to such form, and the object of the present invention can be attained also by the use of, for example, a volume rotary switch and the like.

What is claimed is:

1. An antenna adapter for television comprising: an input connector to be inserted into a standard electrical plug socket for domestic use, which is connected to one end of a feeder intermediately with a condenser, the other end thereof being formed so as to be connectable to the input terminal of an antenna, at least one circuit-changing switch disposed in the midpoint of said feeder for appropriately changing the impedance of said feeder and interconnection means connected to said switch for providing different impedance paths depending on the position of said switch.

2. An antenna adapter for television comprising, an input element to be inserted into a standard electric plug socket for domestic use, which is connected to one end of a feeder intermediately with a fuse and a condenser connected in series, the other end thereof being formed so as to be connectable to the input terminal of an antenna, at least one circuit-changing switch disposed at the midpoint of said feeder for appropriately changing the impedance of said feeder and interconnection means connected to said switch for providing different impedance paths depending on the position of said switch.

3. An antenna adapter for television use comprising:
   an input connector having a pair of plug elements connectable to a standard electric plug socket for domestic use;
   a capacitor disposed in said connector connected in series with one of said plug elements;
   a pair of feeder wires for supplying FM television signal to a television set, said feeder cable being connected to said connector at one end and having means for connection to a television set at the other;

a pair of change-over switches connected at the mid-point of said feeder cable for changing the impedance of said feeder cable by changing the circuit configuration; and interconnection means connected to said switches for providing different impedance paths depending on the position of the switches.

4. An antenna adapter for television use comprising:

an input connector having a pair of plug elements connectable to a standard electric plug socket for domestic use;

a capacitor disposed in said connector connected in series with one of said plug elements;

a pair of feeder wires for supplying FM television signal to a television set, said feeder cable being connected to said connector at one end and having means for connection to a television set at the other;

a pair of change-over switches connected at the mid-point of said feeder cable for changing the impedance of said feeder cable by changing the circuit configuration; and interconnection means connected to said switches for providing different impedance paths depending on the position of the switches; and also wherein the input connector includes a grounding point for grounding one side of said feeder cable.

5. An antenna adapter for television use comprising:

an input connector having a pair of plug elements connectable to a standard electric plug socket for domestic use;

a capacitor disposed in said connector connected in series with one of said plug elements;

a pair of feeder wires for supplying FM television signal to a television set, said feeder cable being connected to said connector at one end and having means for connection to a television set at the other;

a pair of change-over switches connected at the mid-point of said feeder cable for changing the impedance of said feeder cable by changing the circuit configuration; and interconnection means connected to said switches for providing different impedance paths depending on the position of the switches; and also wherein said switches are double pole, double-throw switches, the television side of said feeder cable being connected to the arms of said switches, one pair of outer poles of each switch being connected via said feeder cable to said capacitor and input connector ground, the other pair of outer poles of one switch being unconnected and one of the other pair of outer terminals of the other switch being connected via said feeder cable to the ground of the input connector.

* * * * *